United States Patent
Bernard et al.

(10) Patent No.: US 6,596,346 B2
(45) Date of Patent: Jul. 22, 2003

(54) SILICONE ELASTOMER STAMP WITH HYDROPHILIC SURFACES AND METHOD OF MAKING SAME

(75) Inventors: Andre Bernard, Zurich (CH); Emmanuel Delamarche, Adliswil (CH); Christian Donzel, Prangins/VD (CH); Jöns G. Hilborn, Sigtuna (SE) (CH); Bruno Michel, Adliswil (CH); Richard Stutz, Dottikon (CH); Heiko Wolf, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,525

(22) Filed: Sep. 14, 2001

(65) Prior Publication Data

US 2002/0098364 A1 Jul. 25, 2002

(30) Foreign Application Priority Data

Sep. 29, 2000 (EP) .............................................. 00121513

(51) Int. Cl.[7] .............................. C08J 7/18; H05H 1/24; B05D 3/06
(52) U.S. Cl. ...................... 427/536; 427/491; 427/539; 427/489
(58) Field of Search ................................. 427/491, 508, 427/515, 517, 520, 536, 539, 322, 393.5, 387, 489

(56) References Cited

U.S. PATENT DOCUMENTS

| 4,156,035 A | * | 5/1979 | Tsao et al. | |
| 4,344,981 A | * | 8/1982 | Imada et al. | 427/539 |
| 4,394,403 A | * | 7/1983 | Smith | |
| 4,968,532 A | * | 11/1990 | Janssen et al. | 427/393.5 |
| 4,980,231 A | * | 12/1990 | Baker et al. | 427/393.5 |
| 5,429,839 A | * | 7/1995 | Graiver et al. | 427/393.5 |
| 5,888,656 A | * | 3/1999 | Suzuki et al. | 427/393.5 |
| 5,925,259 A | | 7/1999 | Biebuyck et al. | 216/2 |
| 6,270,860 B1 | * | 8/2001 | Nakata et al. | 427/539 |

OTHER PUBLICATIONS

R.J. Lewis, Sr., Ed, *Hawley's Condensed Chemical Dictionary*, 12th Ed, Van Nostrand Reinhold Co., N.Y., Except, p. 1036–1038, 1993 No month.*

"Monolayers on Disordered Substrates: Self–Assembly of Alkyltrichlorosilanes on Surface–Modified Polyethylene and Poly(dimethylsiloxane)", Gregory S. Ferguson et al., *Macromolecules*, vol. 26, No. 22, 1993, pp5870–5875. No month.

Correlation Between Surface Free Energy and Surface Constitution:, Manoj K Chaudhury et al., *Science*, vol. 255, Mar. 6, 1992, pp1230–1232.

* cited by examiner

Primary Examiner—Marianne Padgett
(74) Attorney, Agent, or Firm—Anthony J. Canale (57) ABSTRACT

A method for fabricating silicone elastomer stamps with hydrophilic surfaces is provided. The concept of polymer grafting is used to produce the stamps. The stamps thus produced have the great advantage that grafting of a thin hydrophilic polymer on a hydrophobic PDMS surface can render PDMS stamps permanently hydrophilic. With such stamps it becomes possible to print aqueous or highly polar inks reproducibly over days and weeks.

21 Claims, 6 Drawing Sheets

SILICONE ELASTOMER STAMP WITH HYDROPHILIC SURFACES AND METHOD OF MAKING SAME

BACKGROUND OF THE INVENTION

1. Field of the Invention

The present invention relates to micro contact printing on substrates. More specifically, the invention relates to hydrophilic silicone elastomer stamps and to the manufacture of such stamps useful in micro contact printing.

2. Background of the Invention

It is often a goal in areas such as electronics, organic and inorganic chemical catalysts, and electrochemistry to rapidly and economically apply to surfaces chemical activating agents. Particularly in the fabrication of microelectronic devices, optics, integrated circuits and the like, it is desirable to deposit patterned metal pathways on a surface in an economically and environmentally sound manner.

Micro contact printing (hereinafter AµCP) is a technique for forming patterns of organic monolayers with micrometer and submicron lateral dimensions. It offers experimental simplicity and flexibility in forming certain types of patterns. Conventionally, such techniques rely on the remarkable ability of self-assembled monolayers of long chain alkanethiolates to form on, e.g., gold or other metals. These patterns can act as nanometer resists by protecting the supporting metal from corrosion by appropriately formulated etchants, or can allow for the selective placement of fluids on hydrophilic regions of the pattern. Patterns of self-assembled monolayers having dimensions that can be less than 1 micrometer are formed by using the alkanethiol as an 'ink', and by printing them on the metal support using an elastomeric 'stamp'. The stamp is fabricated by molding a silicone elastomer using a master prepared by optical X-ray microlithography or by other techniques. Patterning of the surface of such a stamp is, for example, disclosed by Biebuyck et al. in U.S. Pat. No. 5,925,259.

All demonstrations and applications of AµCP so far use patterned stamps which are formed by polymerization of a polydimethylsiloxane (PDMS) elastomer in a mold. After curing, the PDMS stamp retains the negative of the pattern of its mold and can be used for series of inking and printing. Stamps represent a critical object for AµCP comparable to optical Cr/quartz masks for photolithography. For this reason, stamps should carry an accurate pattern, be stable during printing, inking, and peeling off from surfaces (e.g. the mold) but they should be soft enough to intimately contact the substrate onto which they are applied. Stamps should additionally be easy to fabricate and manipulate. Silicone elastomers as a stamp material fulfill the above mentioned requirements almost perfectly.

However, silicone elastomer stamps useful in AµCP suffer from an essential drawback. Their surface, as their bulk, is hydrophobic and can only uptake non polar chemical species present in the ink. Consequently, this restricts the application of AµCP essentially to non polar inks such as alkanethiols and printing them on metallic substrates such as gold, silver or copper. The fabrication of stamps with hydrophilic surfaces would considerably expand the scope of applications of AµCP to inking and printing many types of chemicals on a possibly large variety of substrates provided that these stamps would be capable of conformal contact with substrates and carry an accurate pattern. Inking and printing polar catalysts for electroless deposition of Cu, for example, is impossible with hydrophobic PDMS stamps. PDMS stamps have first to be hydrophilized with an $O_2$— based plasma before inking them with the solution with a solution containing the polar catalysts. This plasma treatment generates, however, a layer on the surface of the stamp which is unstable, thin with an uncontrolled thickness, hydrophilic without any control, and brittle. A second method to hydrophilize stamps applies strong oxidants like chromic acid ($Cr_2O_3^{2-}$) or permanganate ($MnO_4^-$) to a self-assembled monolayer on the surface of PDMS. Like for the first method, the oxidized layer is thin. Such strong oxidation treatments can lead to rough PDMS surfaces which compromise good contact between the stamp and the substrate during printing.

In summary, hydrophilization of stamps should be done in silicone elastomers because it is still the optimal material for fabricating stamps for micro contact printing. This hydrophilization should be as simple as possible, homogeneous and lead to high and controllable yields.

Preferably, the stamps should be hydrophilic on their surface with a good control of both the chemical composition and the thickness of the hydrophilic layer. If the hydrophilic layer is too thin, hydrophobic low-molecular-weight components from the PDMS bulk can migrate through the hydrophilic layer to the surface and cover it and/or the hydrophilic layer can 'reconstruct' towards the bulk of the stamp to minimize its surface free energy. Additionally, too thin hydrophilic layers may not be able to incorporate enough polar ink for well printed patterns. Control over the chemical composition of the hydrophilic layer is equally important to maximize uptake of the relevant species from the ink and to prevent or minimize unwanted side reactions. The hydrophilic layer should also be grafted or deposited employing a chemistry that does not damage the stamp and preserves the accuracy of its dimensions and micropattern.

Alternatively, the entire stamp could incorporate hydrophilic constituents or it could be hydrophilic in bulk. In this case, stamps may prove susceptible to uncontrolled or to strong swelling by polar inks and thus to distortion of their micropattern.

Up to now, an oxygen plasma treatment was sufficient to render the PDMS surface hydrophilic just before use, and a prolonged stability of the hydrophilic layer was not required. Plasma treatment of PDMS surfaces is, e.g., disclosed in Gregory S. Ferguson et al., 'Monolayers on Disordered Substrates: Self-Assembly of Alkyltrichlorosilanes on Surface-Modified Polyethylene and Poly(dimethylsiloxane)', Macromolecules, Vol. 26, No. 22, 1993, pages 5870 ff. and Manoj K. Chaudhury et al., 'Correlation Between Surface Free Energy and Surface Constitution', Science, Vol. 255, 6 Mar. 1992, pages 1230 ff.

BRIEF SUMMARY OF THE INVENTION

It is therefore an object of the present invention to provide hydrophilic stamps for micro contact printing that remain stable over a long period of time.

It is another object of the present invention to provide such hydrophilic stamps where the hydrophilization does not distort the pattern on the stamp.

These and other objects and advantages are achieved by the manufacturing methods and PDMS stamp defined in the independent claims appended hereto.

Preferred embodiments of the invention are described in the dependent claims.

BRIEF DESCRIPTION OF THE SEVERAL VIEWS OF THE DRAWINGS

Preferred embodiments of the present invention will now be described, by way of example only, with reference to the accompanying drawings in which.

DETAILED DESCRIPTION OF THE INVENTION

Detailed Description of the Preferred Embodiment

The present invention exploits the concept of polymer grafting to render the surface of the silicone elastomer stamps hydrophilic. Examples of silicone elastomers suitable for use as stamps include those formed from precursors including the chlorosilanes such as methyl chlorosilanes, ethyl chlorosilanes, and phenyl chlorosilanes, and the like. A preferred silicone elastomer is polydimethylsiloxane (PDMS). Particularly preferred is Sylgard 184™ (Sylgard is a trademark of Dow Corning Corp.).

Polymer grafting is the definition for polymerizations where graft polymers are formed. Employing various chemistries involving homo- and heterocrosslinking, photografting, and photocrosslinking, the present invention uses 'grafting onto' methods as well as 'grafting from' methods. In 'grafting onto', a pre-built polymer is fixed to the surface, whereas in 'grafting from' a polymerization reaction is initiated from the surface and the polymer is formed in situ.

Briefly, Table 1 summarizes the various paths.

TABLE 1

| Method | Step 1 | Step 2 | Step 3 | Step 4 |
|---|---|---|---|---|
| A | $O_2$ plasma | APTS | $BS^3$ | $NH_2$-PEG-$NH_2$ |
| A' | $O_2$ plasma | other $NH_2$-functionalized alkoxysilanes | $BS^3$ | other hydrophilic polymers with primary amino groups |
| B | $O_2$ plasma | APTS | NHS-PEG | |
| B' | $O_2$ plasma | other $NH_2$-functionalized alkoxysilanes | other hydrophilic polymers with NHS-groups | |
| C | $O_2$ plasma | $(RO)_3$Si-PEG | | |
| C' | $O_2$ plasma | $(RO)_3$Si-PEG other hydrophilic polymers with $(RO)_3$Si-groups | | |
| D | $O_2$ plasma | GOPS | CMC | |
| D' | $O_2$ plasma | GOPS | other poly- or oligosaccharide or OH-functional polymer | |
| E | photo crosslinker | $NH_2$-PEG | | |
| E' | photo crosslinker | other hydrophilic polymers with primary amino groups | | |
| F | $O_2$ plasma | Ink with Darocur | UV polymerize HEA | |
| F' | $O_2$ plasma (optional) | Other UV radical initiators | other hydrophilic monomers that undergo radical polymerization | |
| G | immerse in initiator solution | UV polymerize aqueous monomer solution | | |

APTS: aminopropyltriethoxysilane
$BS^3$: bis[sulfosuccinimidyl]suberate
PEG: polyethyleneglycol
NHS: N-hydroxysuccinimide
GOPS: (3-glycidioxypropyl)trimethoxysilane
CMC: carboxymethylcellulose
HEA: hydroxyethylacrylate
HEMA: hydroxymethylmethacrylate The first entry in this table is described as an example in the following. It makes use of crosslinking and functionalization chemistry which is well established in bio- and surface chemistry. It only uses solvents compatible with patterned PDMS stamps and high yield chemistry involving commercial compounds (APTS from Fluka, BS³ from Pierce, NH -PEG-NH from Shearwater).

In the following, PDMS is used as an example for a silicone elastomer to explain the various methods according to the present invention. It should be noted, however, that other silicone elastomers can be used as well.

Grafting Onto, Method (A)

Figure 1:
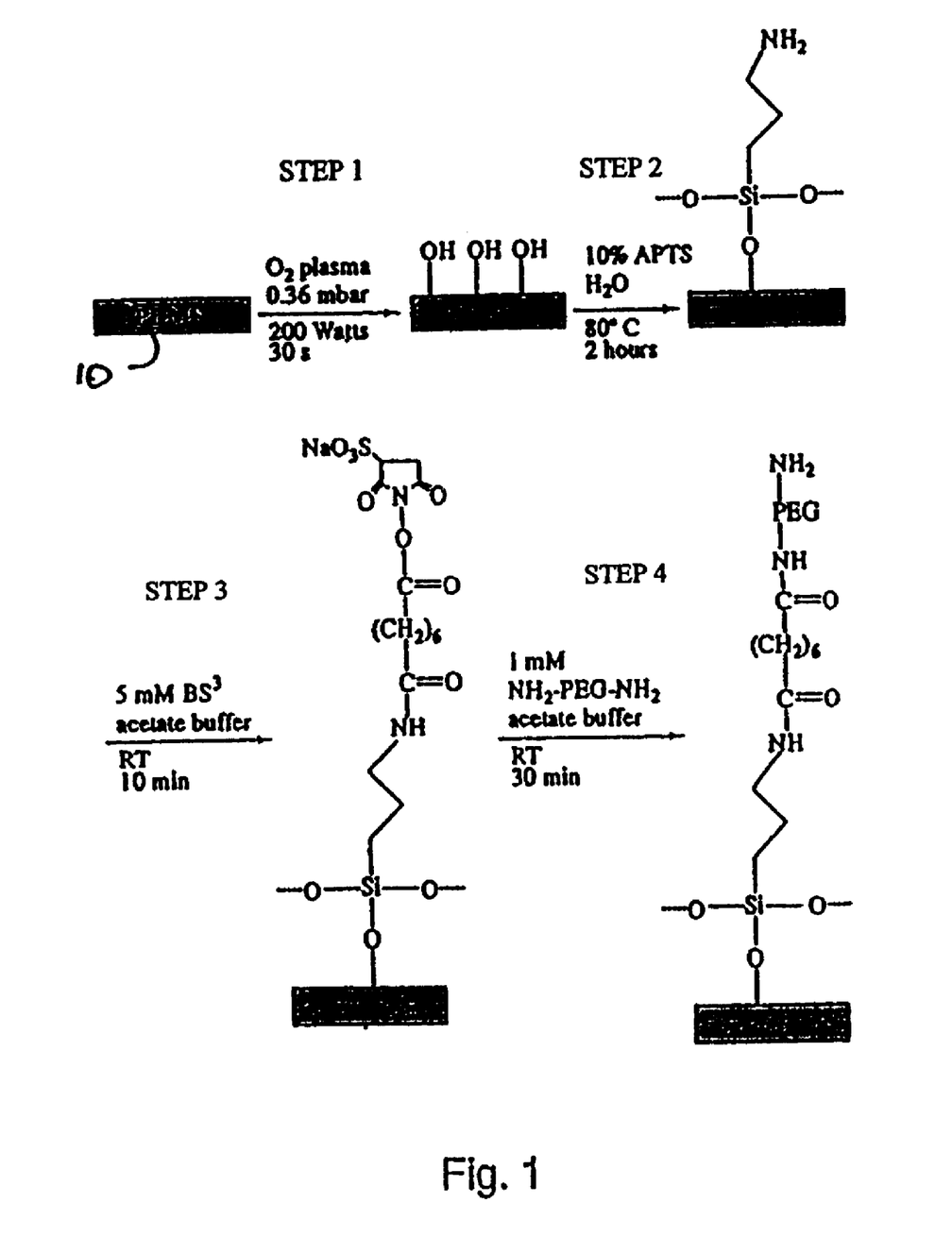
FIG. 1 is a scheme showing the method steps (Steps 1, 2, 3, and 4) according to one aspect of the present invention.

The steps of this method are shown in FIG. 1 as 'Step 1', 'Step 2', 'Step 3', and 'Step 4'. First, hydroxyl functions (—OH) are generated on the surface of the PDMS stamp 10 with a relatively low dose of oxygen plasma sufficient to render the surface reactive. Other functionalities like peroxides, radicals, carboxylates may also be generated during this plasma treatment but they are only transient or do not effect the reaction with hydroxyls. An amino function is introduced onto the surface of the activated stamp by standard silane grafting chemistry. A crosslinker, reactive towards amines on both its ends, provides the link between the APTS-modified surface of the stamp 10 and an amino-functionalized polyethylene glycol (PEG) or other hydrophilic polymer with at least one primary amino group (cf. Method A'). The resulting hydrophilic layer is irreversibly grafted onto the stamp 10.

Stamps treated in this manner were characterized by X-ray Photoelectron Spectroscopy (XPS) and contact angle measurements and the chemistry on the PDMS was tested in parallel on $Si/SiO_2$ surfaces. XPS is a particularly surface-sensitive technique.

Figure 2:
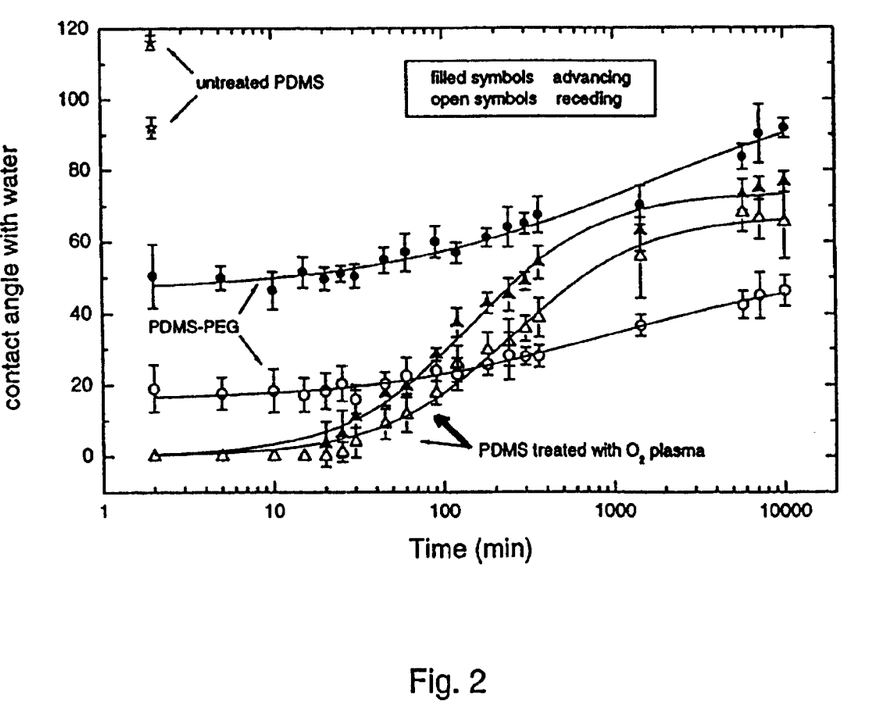
FIG. 2 shows the evolution of contact angles with time of a stamp hydrophilized according to the prior art as compared to a stamp hydrophilized according to the present invention.

FIG. 2 represents the evolution in time of the contact angles (advancing is shown as filled symbols and receding is shown as open symbols) of water as the probe liquid on a flat PDMS surface (reference data points shown as 'untreated PDMS'), PDMS hydrophilized with an oxygen plasma (set of curves labeled 'PDMS treated with $O_2$-plasma'), and PDMS with a layer of a few nanometers of PEG grafted (set of curves labeled 'PDMS-PEG').

In contrast to PDMS hydrophilized with the plasma treatment, the PEG-derivatized PDMS experiences more stable contact angles with water. Importantly, the receding contact angle of the PEG-derivatized PDMS does not increase dramatically with time but remains below 50° even after 21 days of storage in air. This observation underlines the ability of the surface of the PEG-stamp to capture polar components from an ink during inking.

Figure 3:
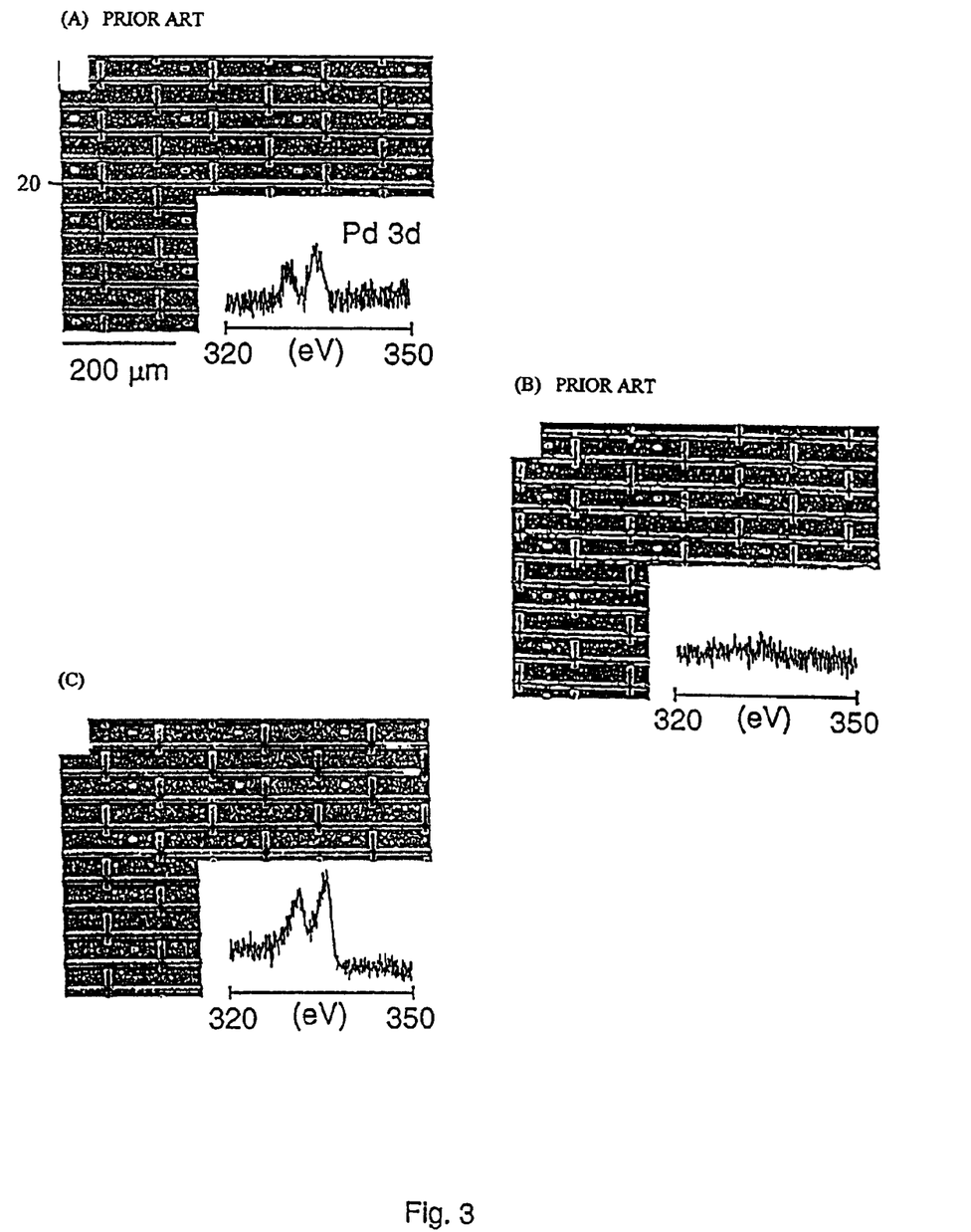
FIGS. 3A–C show scanning electron microscope (SEM) images of electroless deposited Cu on Pd according to the prior art (FIGS. 3A–B) as compared to the present invention (FIG. 3C)

FIG. 3 illustrates the success of hydrophilization of the stamps with the PEG layers by using an important diagnostic: the uptake of a polar Pd catalytic precursor from an ethanolic ink and its printing onto a surface followed by electroless deposition of copper 20.

The insets represent the XPS signal of Pd as it was observed on the surface of the corresponding stamp before printing.

The freshly prepared plasma-oxidized stamp (FIG. 3A) takes up a significant amount of Pd catalyst as can be observed in the XPS signals. The resulting copper structure is well defined with good contrast. After 3 hours at ambient conditions the plasma treated stamps (FIG. 3B) can hardly incorporate any of the polar catalyst into their surface. The electroless deposition produces a copper pattern of inferior quality. In contrast, the PEG derivatized stamp (FIG. 3C) transfers a high amount of the catalyst to the substrate even after it has been stored at ambient conditions for 21 days. Here, the plated copper structure is of high quality.

This grafting strategy is also possible with other amino-functionalized alkoxysilanes instead of APTS and/or with other hydrophilic polymers having at least one primary amino group instead of the amino-functionalized PEG used in the example above (Grafting onto, method A' in Table 1).

A hydrophilic polymer in the context of the present invention includes any polymer that lowers the advancing and/or receding contact angle of a silicone elastomer surface with water after the polymer has been grafted to said surface by any of the methods disclosed herein.

Preferred hydrophilic polymers are: polyethyleneglycol (PEG), polyethyleneimine (PEI), poly (hydroxyethylacrylate) (pHEA) and copolymers containing HEA; poly (hydroxyethylmethacrylate) (PHEMA) and copolymers containing HEMA; polyacrylic acid and copolymers containing acrylic acid; polyacrylamides; natural and modified polysaccharides (cellulose, carboxymethylcellulose, starch); polymers having OH— functionalities like poly(vinylalcohol) (PVA); polymers having sulfonate functionalities, e.g.,poly(styrene sulfonates); and peptides like polylysine.

This list of preferred polymers is exemplary only and should not be regarded as being complete.

Grafting Onto, Method (B)

Instead of using the low molecular linker (BS3) from method A, an NHS-derivatized PEG can be coupled to the APTS resulting in the same kind of hydrophilic grafted layer.

Again, any other amino functionalized alkoxysilane instead of APTS and/or any other hydrophilic polymer having at least one reactive group towards primary amines can be used here (Grafting onto, method B' in Table 1).

Grafting Onto, Method (C)

An alternative treatment uses oxygen plasma treated stamps reacted with an alkoxysilane terminated PEG. The alkoxysilane reacts with the —OH groups generated by the oxygen plasma on the PDMS surface and is then covalently bound to the stamp.

In an experimentally proven example, first, hydroxyl functions (—OH) were generated on the surface of the PDMS stamp with a low dose of oxygen plasma (200W, 30s). Then the stamps were immersed in a 10 mM solution of $(EtO)_3$ Si—PEG $_{3400}$ —Si(OEt)$_3$ (Shearwater) in ethanol for at least 10 minutes. Finally the stamps were rinsed and dried with a stream of nitrogen.

Figure 4:
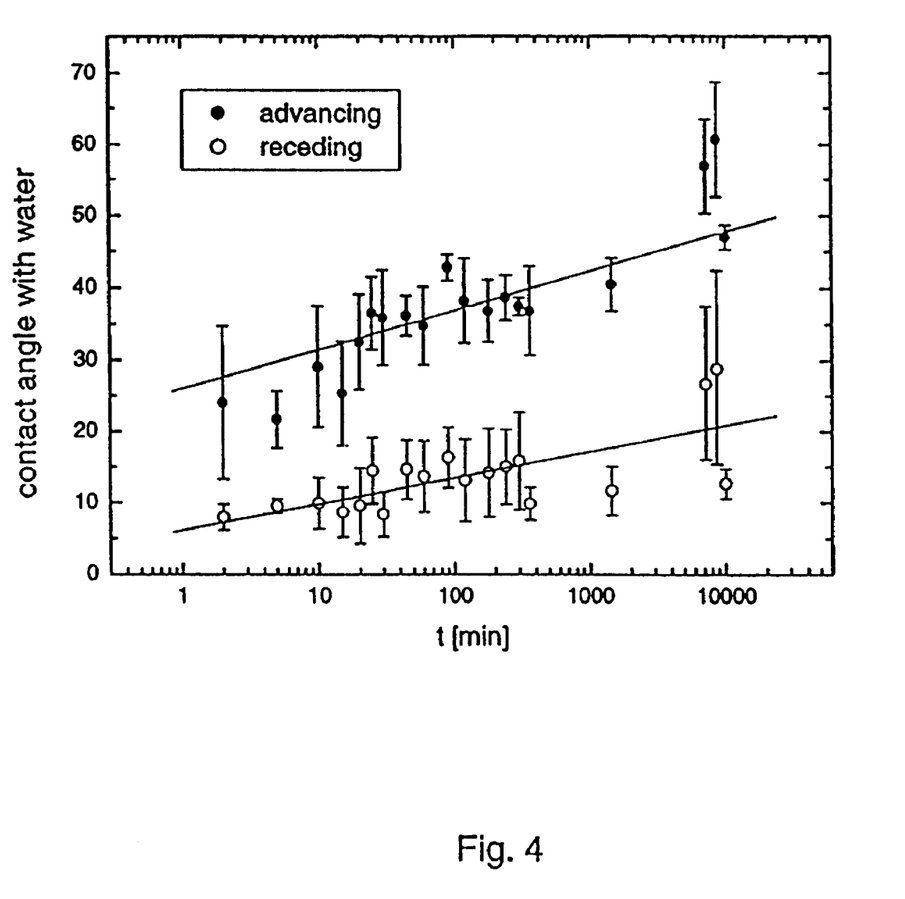
FIG. 4 depicts the evolution of contact angles with time of a stamp manufactured according to one embodiment of the present invention.

FIG. 4 represents the evolution of contact angles during seven days. The receding contact angle after a week of storage at ambient conditions is still below 30°.

Figure 5:
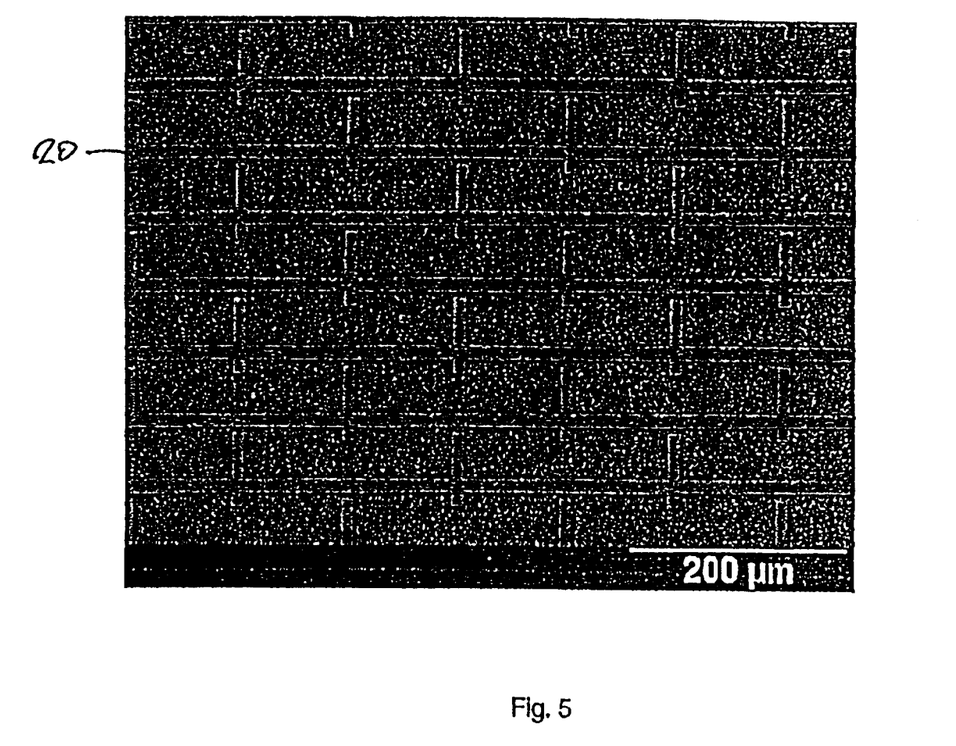
FIG. 5 shows scanning electron microscope images of electroless deposited Cu on Pd according to another embodiment of the present invention.

FIG. 5 shows the result of electroless deposited copper 20 after printing the catalyst with a 4 days old stamp treated as described above. The copper structure is of good quality.

Any other hydrophilic polymer which contains one or more alkoxy silane groups is equally suited for this kind of reaction as well (method C' in Table 1). Another preferred compound for this procedure is SSP-060 trimethoxysilyl-propyl modified (polyethylenimine)(ABCR).

EXAMPLE 1 FOR METHOD C' (TABLE 1)

First, the PDMS stamp (Sylgard 184™) was treated with a low dose of oxygen plasma(120W, 20s). Then, a drop of SSP-060 (trimethoxysilylpropyl modified (polyethylenimine) (ABCR) was applied for 5 minutes. After that the stamp was washed with i-propanol, ethanol, and finally water. Even after 25 days, the receding contact angles of such treated stamps were well below 50° (36° and 43°) whereas a control only treated with plasma reached a receding contact angle of 85° during the same period.

EXAMPLE 2 FOR METHOD C' (TABLE1)

1) Preparation of Mixture A 0.4 g maleic acid anhydride were dissolved in 5 ml i-propanol. This solution was added to 6 g of SSP-060 (trimethoxysilylpropyl modified (polyethylenimine) (ABCR)). The mixture was stirred for 30 minutes and used for further treatment of PDMS stamps.

2) Hydrophilization of Stamps

First, the PDMS stamp (Sylgard 184™) was treated with a low dose of oxygen plasma (120W, 20s). Then a drop of mixture A was applied for 3 to 60 minutes.

After that the stamp was washed with i-propanol, ethanol, and finally water. As a control, one stamp was only plasma ashed with no further treatment.

Figure 6:
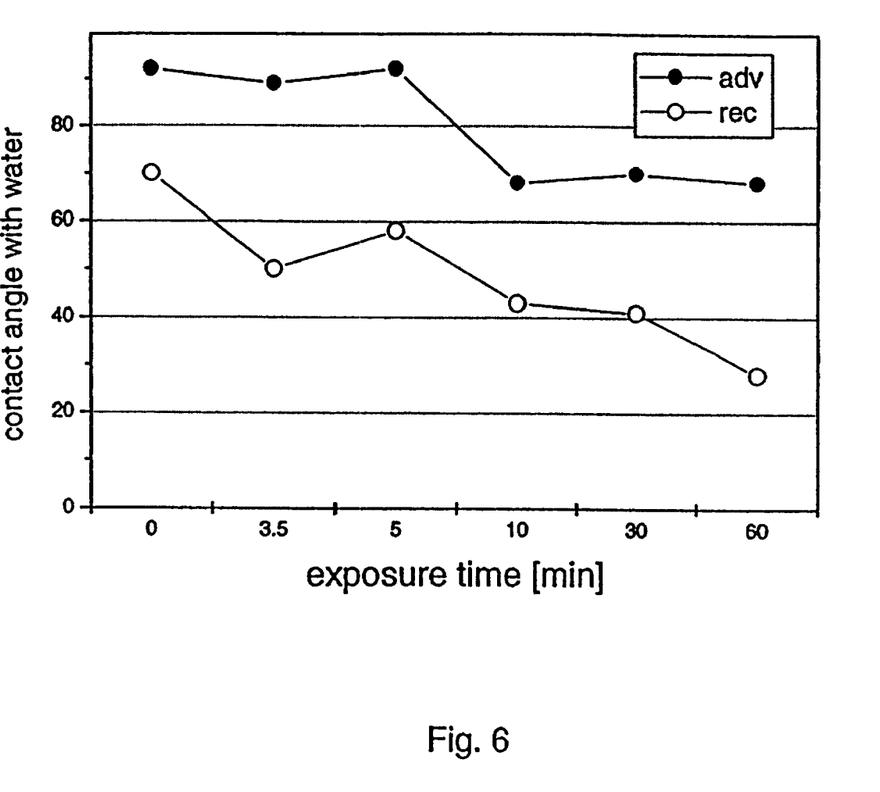
FIG. 6 depicts the contact angles of stamps manufactured according to another embodiment of the present invention.

FIG. 6 shows the contact angles after five days at ambient conditions. The x-axis corresponds to the exposure time to mixture A (0 mm=control). Especially for the longer exposure times, the receding contact angle (open symbols) is well below the control (and below 50°).

Grafting Onto, Method (D)

Another method makes use of the reaction of an epoxy group with hydroxyl moieties of hydrophilic poly- and oligosaccharides.

After a short oxygen plasma treatment the PDMS surface is modified by an alkoxysilane carrying an epoxy function. A preferred compound for this reaction is 3-(glycidoxypropyl)-trimethoxysilline (ABCR).

This epoxy functionalized surface is then grafted with a hydrophilic polymer carrying —OH functions. This polymer can be any natural or modified poly- or oligosaccharide or a synthetic polymer carrying —OH groups. Preferred examples are carboxymethylcellulose (CMC) and polyvinyl alcohol.

EXAMPLE OF METHOD

First, PDMS stamps (Sylgard 184™, Dow Corning) were treated with a low dose of oxygen plasma (120W, 20s). The stamps were incubated in a 1% solution of (3-glycidoxypropyl)-trimethoxysilane (ABCR) in ethanol for 30 minutes at room temperature. After rinsing with ethanol, the stamps were shaken in a CMC (Fluka) solution (in $H_2O$, pH 8–9) for 10 hours at room temperature. The stamps were completely wettable with water after modification. After 1 week, the advancing contact angle was still below 45 degrees.

Grafting Onto, Method (E)

A photoactive crosslinker may also serve as an anchor for the fixation of a hydrophilic polymer to the PDMS surface of the stamp. For this purpose, the stamp is inked with the photoactive crosslinker in one of the standard methods. Then, the stamp is incubated with the hydrophilic polymer and light, such as UV-light, is applied. In this way the hydrophilic polymer is covalently bound to the stamp surface.

Grafting From, Methods (F,G)

Alternatively to the previous methods, hydrophilic polymer chains may be grown from the stamp surface. For this purpose, the stamp is first treated with an initiator to enable a hydrophilic monomer to polymerize from the PDMS surface. The initiator may be any system known to start a radical polymerization process (thermal, irradiation, redox). For ease of description only radical photoinitiators are described.

The stamp can be immersed in a solution of the initiator without any pretreatment (method G) or depending on the nature of the photoinitiator a plasma treatment (method F') on the stamp may support the homogeneous spreading of the initiator on the surface.

The stamp is then treated with a monomer solution (e.g. hydroxyethylacrylate, 50% in water) and UV exposed. The radical polymerization starts from the surface which is then covered with the hydrophilic polymer.

EXAMPLE

Stamps prepared from Sylgard 184™ were immersed in a solution of Darocur (10% in Ethanol) overnight (Darocur is a trademark of Ciba Geigy). After drying a drop of monomer solution (25% hydroxyethyl-methacrylate, HEMA, in water) was placed onto the stamp. Then the stamp was UV irradiated under Argon for 3 minutes. The stamp was finally washed with water and ethanol. As a control, another stamp was treated in exactly the same manner but without placing the monomer solution onto it.

Contact angles: 94° adv, <10° rec; Control: 109° adv, 76° rec

In another example, a stamp was treated as described above using 10% acrylic acid in water instead of HEMA as monomer solution.

Contact angles: 76° adv, <10° rec

To summarize, grafting of a thin hydrophilic polymer on a hydrophobic PDMS surface can render PDMS stamps permanently hydrophilic. With such stamps it becomes possible to print aqueous or highly polar inks reproducibly over days and weeks.

What is claimed is:

1. Method for modifying a surface of a silicone elastomer stamp by means of fixing a pre-built polymer to said surface, comprising the steps of:
   a) activating the surface of said stamp using only a plasma; and
   b) reacting said activated surface with a hydrophilic polymer, wherein said reaction stops when said activated surface is entirely occupied by said hydrophilic polymer.

2. Method according to claim 1, wherein said silicone elastomer comprises methyl chlorosilane, ethyl chlorosilane, or phenyl chlorosilane.

3. Method according to claim 1, wherein said silicone elastomer comprises polydimethylsiloxane (PDMS).

4. Method according to claim 1, wherein in said activating step (a) said surface of said stamp is treated with an $O_2$-plasma.

5. Method according to claim 1, wherein said hydrophilic polymer comprises a polymer with at least one primary amino group.

6. Method according to claim 5, wherein said hydrophilic polymer further comprises polyethyleneglycol (PEG), polyethyleneimine (PEI), poly(hydroxyethylacrylate) (pHEA) or copolymers containing HEA;

poly(hydroxyethylmethacrylate) (pHEMA) or copolymers containing HEMA;

polyacrylic acid or copolymers containing acrylic acid;
polyacrylamides;
natural or modified polysaccharides;
polymers having OH-functionalities;
polymers having sulfonate functionalities: or
peptides.

7. Method according to claim 5, wherein said hydrophilic polymer is an amino-functionalized polyethyleneglycol (PEG).

8. Method according to claim 5, wherein after said activating step (a) further comprising the steps of:
   introducing an amino-alkoxysilane onto the activated surface by means of silane gaffing techniques; and
   applying a crosslinking agent, thus providing a link between the activated surface modified with the amino-alkoxysilane and said hydrophilic polymer.

9. Method according to claim 8, wherein said amino-alkoxysilane is aminopropyltriethoxysilane (APTS) and said crosslinking agent is bis(sulfosuccinimidyl)suberate ($BS^3$).

10. Method according to claim 9, further comprising the step of treating the activated surface with said hydrophilic polymer comprising (3-glycidoxypropyl)trimethoxysilane (ABCR).

11. Method according to claim 1, wherein said hydrophilic polymer comprises a polymer carrying an N—hydroxysuccinimide (NHS) group.

12. Method according to claim 11, wherein said hydrophilic polymer is an NHS-functionalized polyethyleneglycol (PEG).

13. Method according to claim 11, wherein after said activating step (a) further comprising the step of:
   introducing an amino-alkoxysilane onto the activated surface by means of silane grafting techniques before reacting said activated surface with said hydrophilic polymer.

14. Method according to claim 11, further comprising the step of treating the activated surface with (3-glycidoxypropyl)trimethoxysilane (ABCR).

15. Method according to claim 1, wherein said activated surface is reacted with said hydrophilic polymer comprising a poly- or oligosaccharide or a polymer carrying OH-groups.

16. Method according to claim 15, wherein said activated surface is reacted with carboxymethyl cellulose.

17. Method for modifying a surface of a silicone elastomer stamp by means of fixing a pit-built polymer to said surface, comprising the steps of:
   a) activating the surface of said stamp using only a plasma; and
   b) reacting said activated surface with a hydrophilic polymer by immersing said activated surface in a hydrophilic polymer solution comprising one of triethoxysilane-groups and trimethoxysilane-groups dissolved in ethanol, wherein said reaction stops when said activated surface is entirely occupied by said hydrophilic polymer.

18. Method according to claim 17, wherein said hydrophilic polymer is a triethoxysilane-terminated polyethyleneglycol (PEG).

19. Method according to claim 17, wherein said hydrophilic polymer comprises a polymer carrying trimethoxysilane-groups.

20. Method according to claim 17, wherein said hydrophilic polymer is a trimethoxysilane-terminated polyethyleneglycol (PEG).

21. Method according to claim 17, wherein said hydrophilic polymer is trimethoxysilylpropyl(polyethylenimine) (ABCR).

* * * * *